US007964839B1

(12) United States Patent (10) Patent No.: US 7,964,839 B1
Langley et al. (45) Date of Patent: Jun. 21, 2011

(54) UNIVERSAL LED TESTING DEVICE

(75) Inventors: Frank J. Langley, South Freeport, ME (US); Juliet A. Langley, Kailua, HI (US)

(73) Assignee: Optomistic Products, Inc., South Freeport, ME (US)

( * ) Notice: Subject to any disclaimer, the term of this patent is extended or adjusted under 35 U.S.C. 154(b) by 0 days.

(21) Appl. No.: 12/880,216

(22) Filed: Sep. 13, 2010

Related U.S. Application Data

(60) Provisional application No. 61/353,739, filed on Jun. 11, 2010.

(51) Int. Cl.
*H01J 40/14* (2006.01)
(52) U.S. Cl. .......... 250/214 R; 250/227.14; 324/750.01; 324/754.24
(58) Field of Classification Search .............. 250/214 R, 250/214 C, 214 DC, 227.11, 227.14; 324/750.01, 324/750.02, 754.06, 754.23
See application file for complete search history.

(56) References Cited

U.S. PATENT DOCUMENTS 4,808,815 A 2/1989 Langley
7,064,832 B2 * 6/2006 Rogers .......................... 356/406

OTHER PUBLICATIONS

Datasheet entitled *Feasa LED Analyser—Intercircuit Test Models*, Feasa, Ireland Apr. 2010, 2 pages.
Datasheet entitled *Feasa LED Analyser—2 & 3 Channel Incircuit Test Models*, Feasa, Ireland, Apr. 2010 2 pages.
Datasheet entitled *Feasa Optical Head—LED Intensity Testing*, Feasa, Ireland, May 2010, 1 page.

Datasheet entitled *Smart LightProbes*, Optomistic Products, So. Freeport, ME, Oct. 5, 2007, 2 pages.
Datasheet entitled *Trident Smart LightProbe*, Optomistic Products, So. Freeport, ME, 2007, 1 page.
Datasheet entitled *Duplex Smart LightProbe*, Optomistic Products, So. Freeport, ME, 2007, 1 page.
Datasheet entitled *Universal LightProbe Sensors*, Optomistic Products, So. Freeport, ME, Jul. 11, 2010, 1 page.
Datasheet entitled *Universal LightProbe Penta Sensors*, Optomistic Products, So. Freeport, ME, Jul. 12, 2010, 2 pages.

(Continued)

*Primary Examiner* — Kevin Pyo
(74) *Attorney, Agent, or Firm* — Cesari and McKenna, LLP (57) ABSTRACT

Apparatus for optically testing LEDs or other light-emitting components in a wide variety of test environments and to the degree necessary pertinent to the type(s) of faults encountered. In one embodiment, the present invention includes one or more fiber optic probes coupled to a multi-mode sensor unit, incorporating a photo-sensor coupled to a processor which may be programmed to provide a variety of test modes including simple on/off testing, color determination, color matching, wavelength and relative intensity among others. An extremely high sensitivity test mode is also provided for testing LEDs which emit very low intensity light in the microcandela range in products such as automobile/aircraft cockpit control panel lighted push-buttons for night-time viewing. The multi-mode sensor unit operates over a wide dynamic range and is capable of accurately testing LEDs that may be very dim to very bright without adjustment. In another embodiment, a voltage protection circuit is provided which enables the multi-mode sensor unit to safely operate from a supply voltage in the range of approximately 5 volts DC to approximately 40 volts DC while protecting the multi-mode sensor unit from a potentially damaging overvoltage condition. The voltage protection circuit also protects the multi-mode sensor unit against potential damage caused by reverse polarity voltage spikes, or accidental steady-state reverse polarity voltages.

19 Claims, 8 Drawing Sheets

OTHER PUBLICATIONS

Datasheet entitled *Universal LightProbe Spectra Sensors*, Optomistic Products, So. Freeport, ME, Jul. 13, 2010, 2 pages.
Datasheet entitled *Universal LightProbe Spectra ASCII Sensors*, Optomistic Products, So. Freeport, ME, Jul. 12, 2010, 2 pages.
Datasheet entitled *Universal LightProbe Unicolor Sensors*, Optomistic Products, So. Freeport, ME, Jul. 12, 2010, 2 pages.
Datasheet entitled *Universal LightProbe Unicolor Digital Sensors*, Optomistic Products, So. Freeport, ME, Jul. 11, 2010, 2 pages.
Datasheet entitled *LED Color Test Probes*, Kyoritsu Electric Corporation, Richmond Hill, Ontario, Canada, Mar. 2008, 4 pages.

\* cited by examiner

UNIVERSAL LED TESTING DEVICE

The present application claims the benefit of U.S. Provisional Patent Application Ser. No. 61/353,739, filed on Jun. 11, 2010, for a UNIVERSAL LED TESTING DEVICE, which is incorporated by reference herein.

BACKGROUND OF THE INVENTION

1. Field of the Invention

The present invention relates generally to optical testing of light-emitting devices. More specifically, the invention relates to a test apparatus which may be used, in conjunction with automatic test equipment or other equipment, to optically test light emitting diodes (LEDs) or other light-emitting components, in a wide variety of test environments and to the degree necessary pertinent to the type(s) of faults encountered.

2. Background Information

Automatic test equipment (ATE) is typically used to test the electrical functions of complex devices such as, for example, printed circuit boards which may contain a variety of discrete components, integrated circuits and other devices. Printed circuit boards often include light-emitting components, such as LEDs, which must be tested both electrically and optically. Optical testing may involve a simple on/off test (i.e., determining whether a light emitting component is actually illuminated when it should be) or more sophisticated tests such as whether the emitted light exceeds a minimum acceptable intensity; whether the intensities among several components are sufficiently uniform; the color of the emitted light; whether the color of the emitted light matches a predetermined reference, and the like, depending on the commonly encountered faults/failures at any given stage in the manufacture of products using LEDs.

Although an LED is a relatively simple device in itself, the environments in which LEDs require optical testing vary widely. For example, LEDs which require optical testing may exist in a laboratory environment in which there is no impediment to gaining physical access to the LEDs and the amount of time for testing is not critical. In contrast, in other test environments such as mass-production components, assembled printed circuit boards or embedded finished products, there is often extremely limited physical access to the LEDs. Further, the degree of optical testing required and the limited time available for testing often present significant constraints on an optical test solution.

Another constraint on an optical test solution arises from the wide range of luminous intensities produced by present day LEDs. LEDs which are commercially available today typically have luminous intensities ranging from one or two millicandelas (mcd) to thousands of mcd (i.e., a range of four orders of magnitude). Moreover, very low light level illuminated switch button icons used in automobile and aircraft control panels for night-time viewing are typically in the 10 to 200 microcandela (μcd) range. Consequently, an optical test solution must provide a very wide dynamic range of sensitivity in order to accurately optically test such components.

Another significant constraint on an optical test solution is the high density of closely spaced components found on assembled printed circuit boards. In particular, commonly used surface mount LEDs may be mounted on 0.050 inch (1.27 mm) centers. Such close component spacing presents a challenge in terms of preventing interference from light emitted by LEDs that are adjacent to a particular LED under test.

Yet another significant constraint on an optical test solution is the supply voltage necessary to power the sensor. For example, in automotive applications, the standard supply voltage is 12 volts DC. In industrial and avionics applications, the standard supply voltage is 24 and 28 volts DC, respectively. For consumer electronics applications, the standard supply voltage is 5 volts DC. Thus, a sensor intended for consumer electronics applications and designed to operate from a supply of 5 volts DC is likely to be seriously, if not irreparably, damaged should it be inadvertently exposed to the much higher supply voltages used in other applications, or the polarity of the supply reversed.

In addition, an optical test should generate output signals which not only represent the results of the test but which are compatible with ATE or data collection equipment as may be required by a particular application.

SUMMARY OF THE INVENTION

In brief summary, the present invention provides an apparatus for optically testing LEDs or other light-emitting components in a wide variety of test environments and to whatever degree necessary pertinent to the types of faults encountered. In one embodiment, the present invention includes one or more fiber optic probes coupled to a very small multi-mode sensor unit, including a photo-sensor coupled to a processor which may be programmed to provide a variety of test modes including simple on/off testing, color determination, color matching, wavelength and relative intensity among others. The multi-mode sensor unit operates over a wide dynamic range and is capable of accurately testing LEDs that may be very dim to very bright without adjustment.

In another embodiment, an extremely high sensitivity test mode is also provided for testing LEDs which emit very low intensity light, in products such as automobile/aircraft cockpit control panel lighted push-buttons for night time viewing.

In another embodiment, a voltage protection circuit is provided which enables the multi-mode sensor unit to safely operate from a supply voltage in the range of approximately 5 volts DC to approximately 40 volts DC while protecting the multi-mode sensor unit from a potentially damaging over-voltage condition. The voltage protection circuit also protects the multi-mode sensor unit against potential damage caused by reverse polarity voltage spikes, or accidental steady-state reverse polarity voltages.

In another embodiment, the present invention may produce analog output signals, digital output signals or both which represent the results of the selected test modes. Output signals which are directly compatible with conventional ATE as well as computer-hosted data logging applications are available.

In another embodiment, the present invention is packaged in a very small, compact housing from which one or more very fine fiber optic probes extend. By virtue of their small diameters, the fiber optic probes are capable of reaching LEDs mounted as close as 0.050 in centers. Where space permits, the fiber optic probes may be omitted and the housing simply mounted coaxially with the LED or other light-emitting component under test.

BRIEF DESCRIPTION OF THE DRAWINGS

The invention may be better understood by referring to the following description in conjunction with the accompanying drawings in which like reference numerals indicate identical or functionally similar elements.

DETAILED DESCRIPTION OF AN ILLUSTRATIVE EMBODIMENT

Figure 1A:
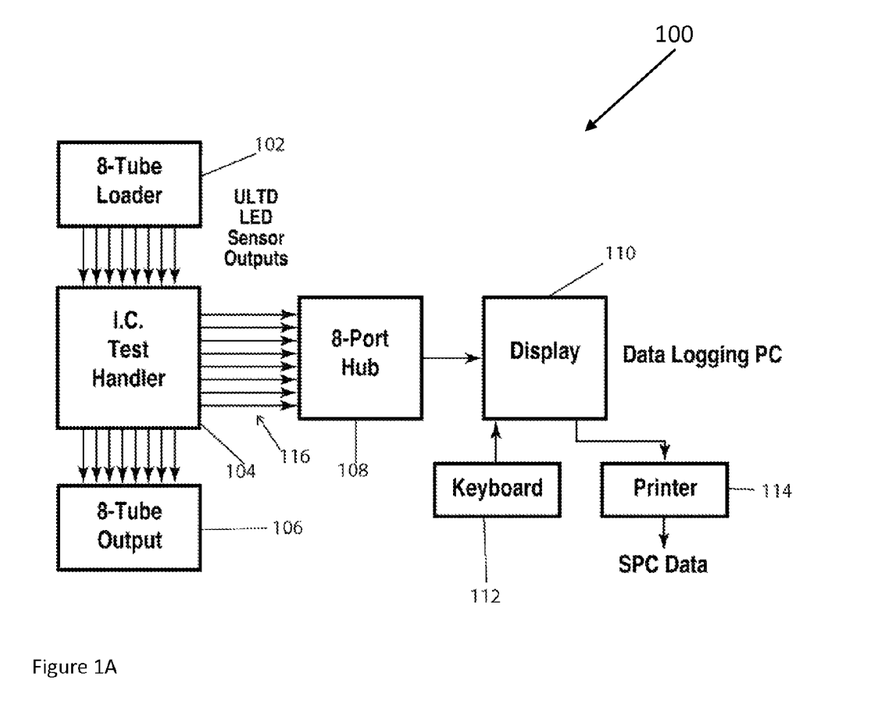
FIG. 1A is a block diagram of an integrated circuit component handler test environment in which the present invention may be used to perform optical testing of light-emitting components.

FIG. 1A shows a test environment 100 in which an integrated circuit (IC) component handler 104 receives components to be tested from an 8-tube loader 102. Handler 104 may represent a handler such as those sold by Aetrium Incorporated or any of a number of other vendors. Components for which testing is complete are returned to an 8-tube unloader or output 106. In order to perform desired optical tests on components passing through handler 104, an apparatus constructed in accordance with the present invention and described below, may be incorporated in handler 104. When so incorporated, output signals 116 which represent the results of optical tests performed within handler 104 are passed to an 8-port hub 108. Hub 108 effectively multiplexes output signals 116 to a data logging personal computer (PC) 110 which is coupled to a keyboard 112 and printer 114. A software application (not shown) running on data logging PC 110 may be used to process, record, display or print information received from hub 108, thereby providing statistical process control (SPC) data.

Figure 1B:
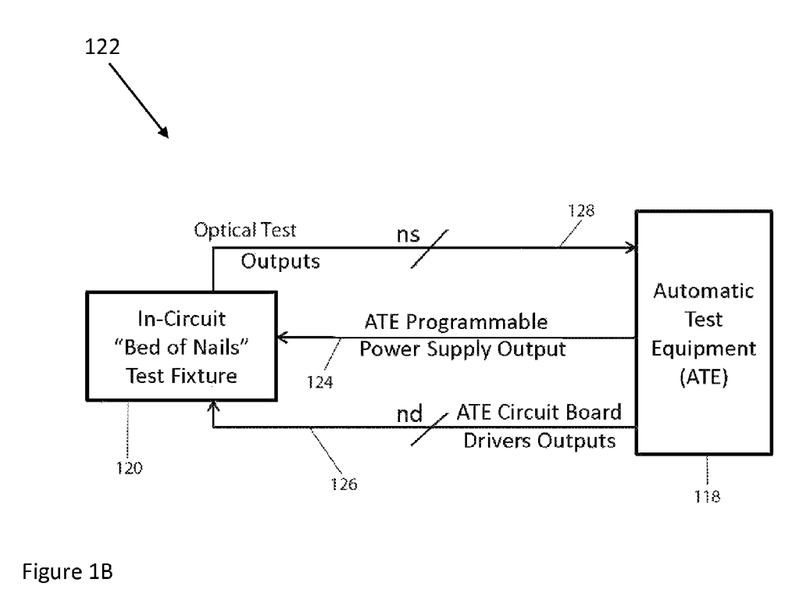
FIG. 1B is a block diagram of an automatic test equipment environment in which the present invention may be used.

FIG. 1B shows a test environment 122 in which automatic test equipment (ATE) 118 is coupled to an in-circuit test fixture 120 often referred to as a "bed of nails." ATE 118 may represent an HP/Agilent 3070 system, GenRad/Teradyne 228X or equivalent system. ATE 118 includes a programmable power supply whose output 124 is applied to test fixture 120. ATE 118 also provides circuit board driver outputs 126 which are used, in accordance with a test program running on ATE 118, to drive various components mounted on a circuit board (not shown) secured in test fixture 120. If the circuit board includes components that must be optically tested, an apparatus such as that described below may be incorporated within test fixture 120 using the power supply voltage programmed by the test engineer, and thereby subject to error. When so incorporated, output signals 128 which represent the results of optical tests are returned to ATE 118.

Figure 1C:
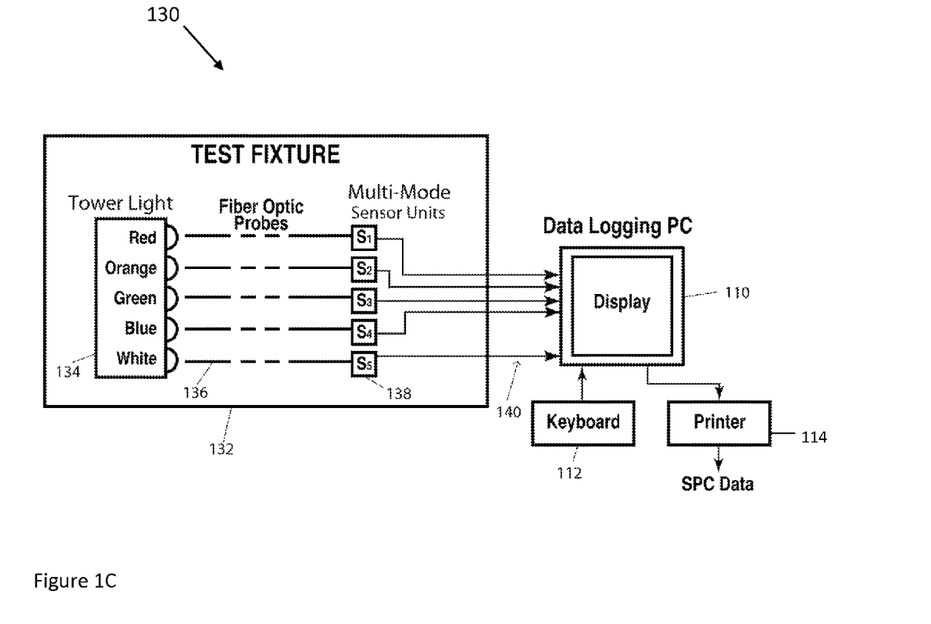
FIG. 1C is a block diagram of a finished product test environment in which the present invention may be used.

FIG. 1C shows a test environment 130 in which a finished product which contains light-emitting components is being optically tested. Specifically, a test fixture 132 is dimensioned and adapted to receive a finished multi-color tower light 134. Tower light 134 is constructed of "bands" of LEDs of different colors, namely, red, orange, green, blue and white. Optical testing of tower light 134 is performed by a series of fiber optic probes 136 which are coupled, respectively, to multi-mode sensor units 138 as described below. Output signals 140 produced by multi-mode sensor units 138 are coupled to a data logging personal computer PC 110 like that shown in FIG. 1A.

Figure 2:
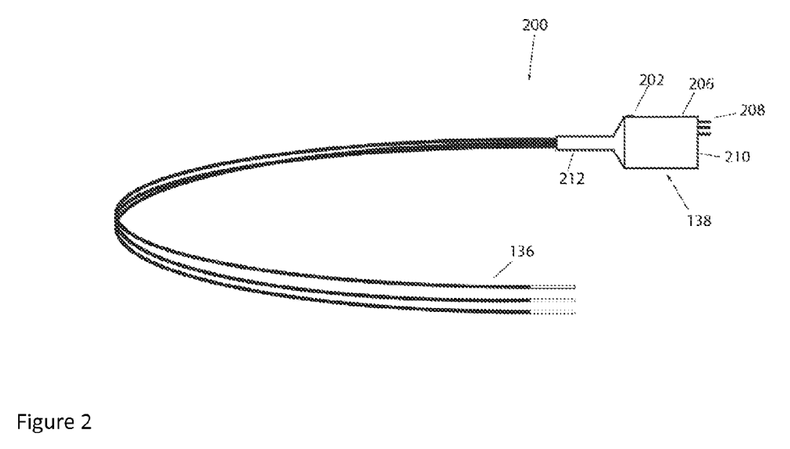
FIG. 2 is an exterior view of an apparatus for performing optical testing constructed in accordance with a preferred embodiment of the present invention.

The three test environments illustrated in FIGS. 1A-1C each present different combinations of technical constraints in terms of performing rapid, accurate, low-cost optical testing of LEDs (or other light-emitting components). However, as shown in FIG. 2, a universal LED testing apparatus 200 constructed in accordance with one or more embodiments of the present invention will when appropriately configured operate satisfactorily in each of those test environments as well as many others. A non-conductive casing 206 includes a snout 212 from which up to three 0.050 in. diameter stainless-steel tipped fiber-optic probes 136 extend. When less than three fiber-optic probes 136 are needed, dowel pins of approximately the same diameter as the probes are used to fill the available space within snout 212. A cup-tipped set screw 202 is used to secure the ends of probes 136 within casing 206. Analog and digital output interface (wire-wrap) pins 208 extend from one end of casing 206 opposite snout 212. A programming pin 210 extends from casing 206.

For test environments in which there is sufficient room to place the multi-mode sensor unit 138 of the apparatus 200 in close proximity to an LED under test, fiber-optic probes 136 may be omitted and snout 212 would be placed coaxially with the center of the LED. Conversely, fiber-optic probes 136 may be used to reach individual LEDs which are closely spaced or which are found in a test environment that prevents placement of casing 206 in close proximity to an LED under test.

Figure 3:
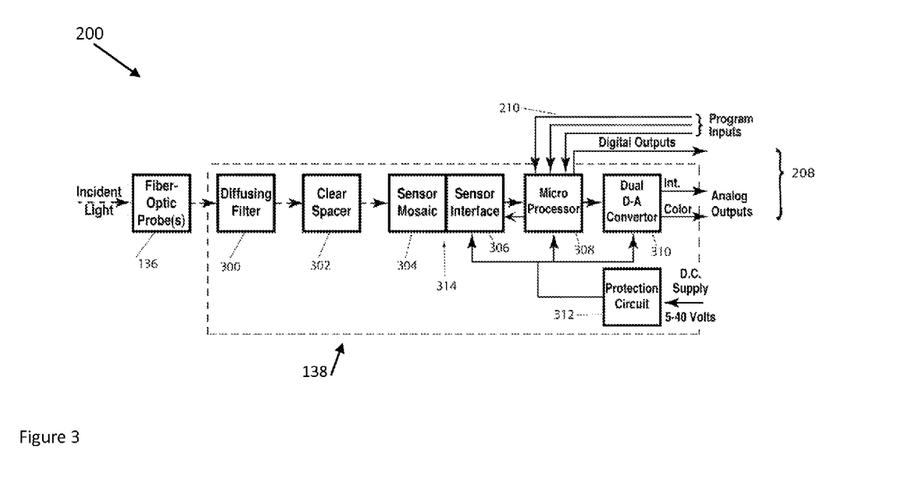
FIG. 3 is a block diagram of the components of the apparatus shown in FIG. 2.

With reference now to FIG. 3, the internal construction of apparatus 200 is shown in block diagram form. For the sake of consistency and clarity, like reference numbers are used to identify like items first shown in earlier figures. Fiber-optic probes 136 are optically coupled to a diffusing filter 300. A clear spacer 302 is disposed between diffusing filter 300 and a sensor mosaic 304 of a photo-sensor 314. A sensor interface 306 is coupled to a microprocessor or microcontroller 308, which in turn is coupled to a dual digital-to-analog (D-A) converter 310. A voltage protection circuit 312 is coupled to photo-sensor 314, microprocessor 308 and D-A converter 310.

Because light exiting fiber-optic probes 136 is uncollimated and the axes of the probes may not be centered with respect to either the center of snout 212 or photo-sensor 314, diffusing filter 300 serves to diffuse such light and foster more even illumination of sensor mosaic 304.

Clear spacer 302 serves to effectively expand the field-of-view of sensor mosaic 304 to allow the imaging plane of the mosaic to capture light from all of fiber-optic probes 204 while tolerating off-center misalignment errors in the assembly process.

Photo-sensor 314 may be implemented with any of a number of commercially available products including, for example, model TCS-3200 programmable color light-to-frequency converter sold by Texas Advanced Optoelectronic Solutions, Inc. Similarly, microprocessor 308 may be implemented with any of a number of commercially available microprocessors or microcontrollers including, for example, model PIC12F683 sold by Microchip Technology, Inc. The TCS-3200 produces an output signal in the form of a square wave whose frequency is proportional to the intensity of light impinging on its sensor mosaic 304. By virtue of the array of microscopic photodiodes and associated color filters present in sensor mosaic 304, it is possible to reliably identify the color of the impinging light as well as its relative intensity.

Dual D-A converter 310 may be implemented with any of a number of commercially available products, for example, model TLV5637 sold by Texas Instruments.

Voltage protection circuit 312 may be implemented, for example, with a model LM2931 voltage regulator sold by ON Semiconductor. Voltage protection circuit 312 enables the multi-mode sensor unit 138 of the apparatus 200 to safely operate from essentially any DC power supply ranging from approximately 5 to 40 volts DC, thereby enabling use in many different test environments across many applications, as well as protecting the multi-mode sensor unit 138 of the apparatus from programming errors in the use of programmable power supplies. In addition, voltage protection circuit 312 blocks negative steady-state or transient voltages up to approximately −18 volts DC, thereby providing reverse polarity voltage protection for the multi-mode sensor unit 138 of the apparatus 200 from back emf inductive spikes caused, for example, by disconnected relay solenoids connected to the DC power supply, or from accidental errors in the installation of the multi-mode sensor unit 138 of the apparatus 200 resulting in the reverse polarity of the power supply.

Figure 4:
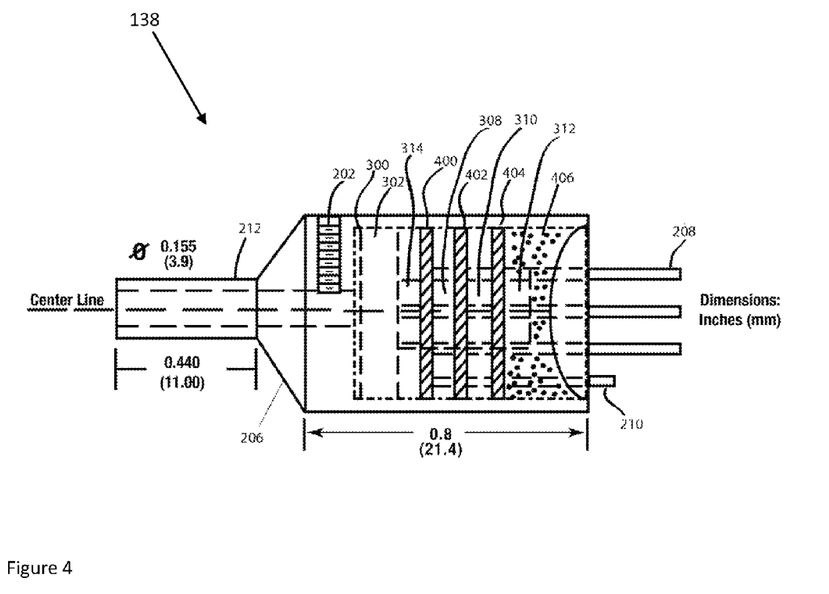
FIG. 4 is a cross-section of the housing of the multi-mode sensor used in the apparatus shown in FIG. 2.

FIG. 4 is a cross-section of housing 206 of the multi-mode sensor unit 138 shown in FIG. 2. The actual dimensions shown are for illustrative purposes and to convey an understanding of how small and compact the multi-mode sensor unit 138 of the apparatus 200 may be. Three small, round printed circuit boards 400, 402 and 404 are disposed within housing 206. Photo-sensor 314 is mounted on circuit board 400. Similarly, microprocessor 308 is mounted on the back of circuit board 400, dual D-A converter 310 is mounted on circuit board 402, and voltage protection circuit 312 is mounted on circuit board 404. A black, opaque compound 406 is used to hermetically seal the wide end of casing 206.

Figure 5:
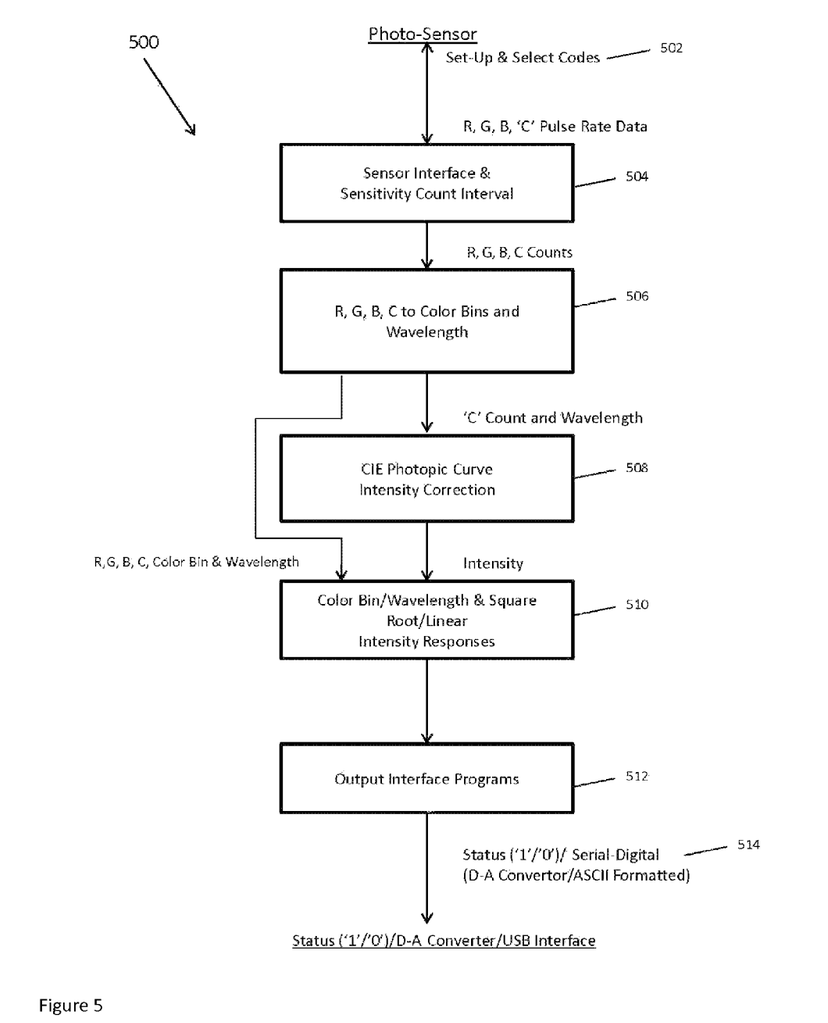
FIG. 5 is a flowchart illustrating a plurality of test modes which the apparatus shown in FIG. 2 may be programmed to perform.

FIG. 5 is a flowchart illustrating a plurality of test modes 500 which the multi-mode sensor unit 138 of the apparatus 200 may be programmed to perform in order to optically test one or more LEDs or other light emitting components to whatever degree necessary pertinent to the types of faults encountered in any given LED test environment. In general, various ones of test modes 500 may be performed to determine (a) simply whether an LED is illuminated (regardless of color or relative intensity); (b) whether an LED is illuminated and the emitted light matches a predetermined color; (c) whether an LED is illuminated, as well as the color band and relative intensity of the emitted light; (d) whether an LED is illuminated, as well as the wavelength and relative intensity of the emitted light (with wavelength and relative intensity represented as output voltages or as ASCII serial-digital data); and (e) the relative shade of white of an LED. Details of exemplary test modes will now be described with reference to FIGS. 3 and 5.

As indicated by reference number 502, microprocessor 308 outputs digital signals to photo-sensor 314 to set-up photo-sensor 314 for a selected test mode. More specifically, appropriate digital signals are applied to photo-sensor 314 to select a desired output frequency scaling as well as a desired photodiode filter type (e.g., red, green, blue or clear or R, G, B, C).

At step 504, microprocessor 308 receives a digital signal from sensor interface 306 of photo-sensor 314. That digital signal is pulse rate data, the frequency of which is directly proportional to the intensity (irradiance) of the light then impinging on sensor mosaic 304 and the previously selected red, green, blue or clear filtered photo-diodes. The period of time for which microprocessor 308 waits to receive pulse rate data for a particular filter type (sensitivity count interval) is programmable. Thus, when testing relatively bright LEDs or other light emitting components, a lower sensitivity (i.e., shorter count interval) test mode will generally yield accurate results. Conversely, when testing a relatively dim LED or other light emitting component, a higher sensitivity (longer count interval) may be programmed to obtain the desired accuracy (at the cost of somewhat slower test performance)

At step 506, microprocessor 308 compares the data received for each of the red, green, blue and clear filtered photo-diode groups of mosaic 304 and makes a determination of both the color and wavelength of the light emitted by the LED or other component under test. At step 508, microprocessor 308, using the previously received clear filter data as well as the previously determined wavelength, applies a CIE photopic curve as a correction in determining the relative intensity of the light impinging on sensor mosaic 304.

At step 510, microprocessor 308 generates output data representing relative intensity. The relative intensity may be represented with a linear response characteristic (providing limited dynamic range without range adjustment), or with a shaped response characteristic such as output voltage proportional to the square root of intensity (providing extended dynamic range without range adjustment and with high-resolution for low-intensity LEDs).

At step 512, microprocessor 308 uses an output interface program to output test results in a form suitable and necessary for any specific test environment. For example, as indicated by reference number 514, a simple logic "1" may be output as a test result (indicating that the LED under test was illuminated), while a logic '0' indicates that no illumination was detected, or alternatively, a logic "1" may be output as a test result indicating that the LED under test was both illuminated and of the correct color, if required. The logic "1" or logic "0" constitutes a simple 1-bit per-LED digital response which can be grouped with other similarly programmed multi-mode sensor outputs to form 8-bit bytes or n-bit words for fast parallel data acquisition in ATE/PC-based test systems as in FIG. 1C.

In an integrated circuit component handler or other PC-based test environment, test results in the form of ASCII-formatted serial-digital data may be output by microprocessor 308 for collection by a data logging PC (as in FIG. 1A). The red, green and blue filter values, represented in ASCII serial-digital, may be used to determine the relative shade of white, such as yellowish white versus blueish white. Similarly, the raw values generated by the red, green and blue filters, expressed in ASCII serial-digital form, may be used to detect changes in the characteristics of photo-sensor 314 due to variations in the manufacturing process. This may be done by observing the raw values while exposing photo-sensor 314 to three test LEDs (red, green and blue) of the same spectral characteristics used by the manufacturer to test the photo-sensor. The observed values should match the manufacturer's published specifications.

For ATE test environments (FIG. 1B), test results may be represented by analog voltages generated by the dual D-A converter 310 in response to serial-digital data produced by microprocessor 308, with the ATE operating in the analog voltmeter mode. For example, one of the dual D-A converter channels can be used to output analog voltage proportional to the relative intensity of an LED under test only if the LED is the correct color, as a minimum single-wire LED color and intensity interface. Or, alternatively, both channels of the dual D-A converter can be used to output separate voltages proportional to the relative intensity and the color band (B, G, Y, O, R, or white) of the LED under test, respectively, without the need to convert LED wavelength to visual color and therefore reducing ATE test time.

Figure 6:
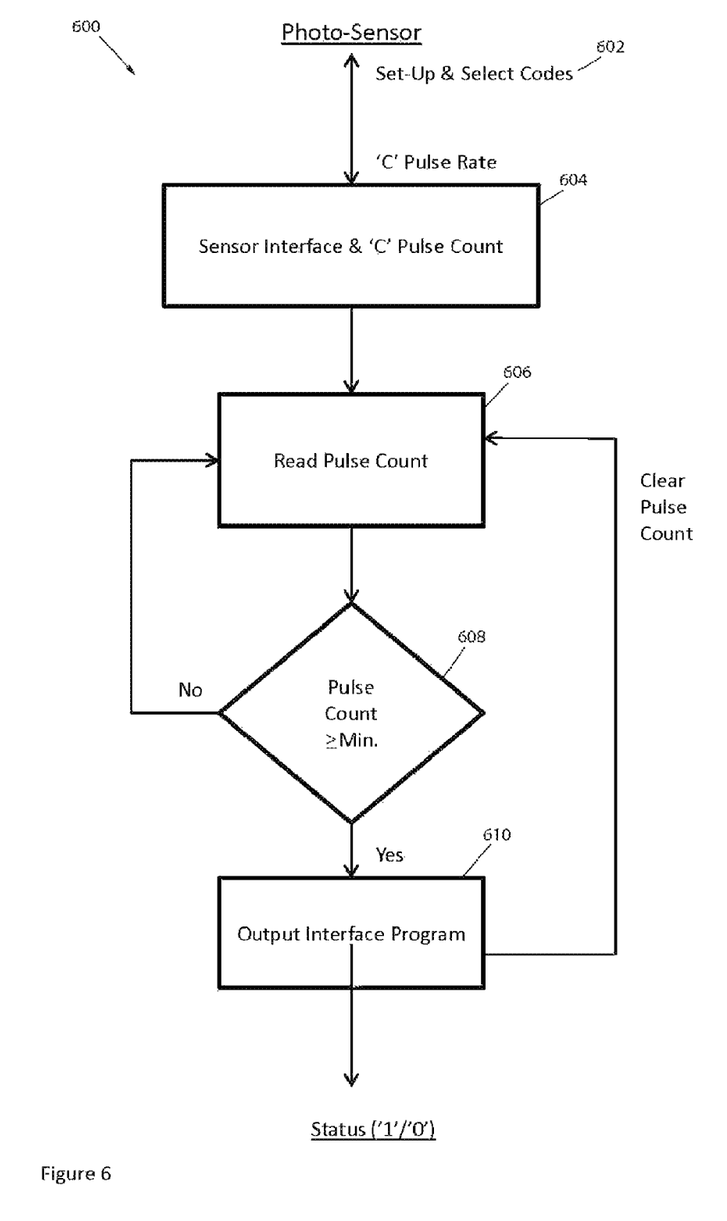
FIG. 6 is a flowchart illustrating an extremely high sensitivity test mode which the apparatus shown in FIG. 2 may be programmed to perform.

FIG. 6 is a flowchart illustrating an extremely high sensitivity test mode 600 which the multi-mode sensor unit 138 of apparatus 200 may be programmed to perform in order to optically test one or more very dim LEDs or other light emitting components of any color and luminous intensity as low as 10 microcandelas by interchanging the three smaller aperture 0.050 inch (1.27 mm) diameter probes (136) shown in FIG. 2, with a single wider aperture 0.109 inch (2.7 mm) diameter probe.

At step 602, microprocessor 308 outputs digital signals to photo-sensor 314 to set-up photo-sensor 314 for test mode 600. More specifically, appropriate digital signals are applied to photo-sensor 314 to select a desired output frequency scaling as well as the clear filtered photo-diodes in order to achieve optimum sensitivity and highest frequency for any color LED, compared to that possible with the lower sensitivity red, green and blue filtered photo-diodes, and also reducing the photo-sensor setup and output signal reading times to only that required for the clear filtered sensing.

At step 604, microprocessor 308 receives a digital signal from sensor interface 306 of photo-sensor 314. The digital signal is pulse rate data, the frequency of which is proportional to the intensity (irradiance) of the light then impinging on sensor mosaic 304, for the previously selected clear filtered photo-diodes. At step 606, microprocessor 308 reads the received pulse count and, at step 608, determines whether the pulse count exceeds a predetermined minimum count. If not, the program control of microprocessor 608 loops and again reads the received pulse count. In effect, microprocessor 608 is treating the test in progress as incomplete and is waiting for additional pulses to be received from sensor interface 306. By extending the time period for which microprocessor 608 waits to receive additional pulses, test mode 600 is able to accurately and reliably determine whether an LED or other light-emitting component is actually illuminated even though it is emitting light with an intensity as low as 10 microcandelas. Similarly, the duration of the wait period can be programmed to be consistent with any minimum acceptable intensity for the LED or other light-emitting component under test.

If, at step 608, the pulse count meets or exceeds the preprogrammed minimum count within the preprogrammed wait time, consistent with minimum acceptable intensity, then microprocessor 308 considers the test to be complete and uses an output interface program at step 610 to output a test result in the form of a logic "1" to indicate that the LED or other light-emitting component under test was sufficiently illuminated. Alternatively, if at step 608 the pulse count does not meet or exceed the preprogrammed minimum count within the preprogrammed wait time, then microprocessor 308 considers the test to be complete and uses an output interface program at step 610 to output a test result in the form of a logic '0' to indicate that no illumination was detected, or the illumination failed to meet or exceed the minimum acceptable intensity.

The foregoing description has been directed to particular embodiments of this invention. It will be apparent, however, that other variations and modifications may be made to the described embodiments, with the attainment of some or all of their advantages. Additionally, the procedures or processes may be implemented in hardware, software, embodied as a computer-readable medium having program instructions, firmware, or a combination thereof. Therefore, it is the object of the appended claims to cover all such variations and modifications as come within the true spirit and scope of the invention.

What is claimed is:

1. An apparatus for optically testing one or more light emitting components, said apparatus comprising:
   a multi-mode sensor unit for receiving light emitted from one or more light-emitting components under test, said multi-mode sensor unit including a photo-sensor coupled to a processor, said multi-mode sensor unit providing a plurality of test modes including modes for determining whether said light emitting component is illuminated, whether said emitted light matches a predetermined color, and determining a relative intensity of the emitted light;
   said processor responsive to at least one input control signal for programming and selecting one or more of said plurality of test modes to be performed, said processor providing one or more digital output signals representing results of said one or more selected test modes;
   a digital-to-analog converter, coupled to said processor, for producing a first analog output signal representing color of said emitted light, and a second analog output signal representing relative intensity of said emitted light; and
   a voltage protection circuit, coupled to said photo-sensor, processor and digital-to-analog converter, which enables said multi-mode sensor unit to operate using a supply voltage in a range of approximately 5 volts DC to approximately 40 volts DC, and which blocks negative voltages, steady-state or transient, up to approximately −18 volts DC, thereby providing overvoltage and reverse polarity protection for said apparatus.

2. The apparatus as in claim 1 further comprising one or more fiber optic probes each of which has a first end and a second end, each said first end for receiving light emitted from a predetermined one of said one or more light emitting components under test, each said second end coupled to said multi-mode sensor unit.

3. The apparatus as in claim 2 wherein each said second end of each of said fiber optic probes is coupled to a diffusing filter, said diffusing filter causing light passing from said probes to more evenly illuminate said photo-sensor.

4. The apparatus as in claim 3 wherein a transparent spacer is disposed between said diffusing filter and said photo-sensor, said transparent spacer effectively expanding a field of view of said photo-sensor.

5. The apparatus as in claim 1 wherein said second analog output signal is a voltage which is directly proportional to said relative intensity of said emitted light.

6. The apparatus as in claim 1 wherein said second analog output signal is a voltage which is proportional to a square root of said relative intensity of said emitted light.

7. The apparatus as in claim 1 wherein said first analog output signal is a voltage whose magnitude represents said color of said emitted light.

8. The apparatus as in claim 1 wherein one of said one or more digital output signals includes values for a wavelength and relative intensity of said emitted light.

9. The apparatus as in claim 1 wherein said apparatus is capable of performing optical testing of said one or more light emitting components in an integrated circuit component handler test environment.

10. The apparatus as in claim 1 wherein said apparatus is capable of performing optical testing of said one or more light emitting components in an automatic test equipment environment.

11. The apparatus as in claim 1 wherein said apparatus is capable of performing optical testing of said one or more light emitting components in a finished product test environment.

12. The apparatus as in claim 1 wherein said apparatus is configurable for performing optical testing of said one or more light emitting components in a plurality of test environments including at least an integrated circuit component handler, automatic test equipment, and finished product test environments.

13. An apparatus for optically testing one or more light emitting components, said apparatus comprising:

a multi-mode sensor unit for receiving light emitted from one or more light emitting components under test, said multi-mode sensor unit including a photo-sensor coupled to a processor, said multi-mode sensor unit providing a test mode for testing light emitting components which emit low intensity light as low as 10 microcandelas;

said processor responsive to at least one input control signal for programming and selecting said test mode, said processor providing a single digital output signal representing results of said test mode; and a voltage protection circuit, coupled to said photo-sensor, said processor and a digital-to-analog converter, which enables said multi-mode sensor unit to operate using a supply voltage in a range of approximately 5 volts DC to approximately 40 volts DC, and which blocks negative voltages, steady-state or transient, up to approximately −18 volts DC, thereby providing overvoltage and reverse polarity protection for said apparatus.

14. The apparatus as in claim 13 further comprising one or more fiber optic probes each of which has a first end and a second end, each said first end for receiving light emitted from a predetermined one of said one or more light emitting components under test, each said second end coupled to said multi-mode sensor unit.

15. The apparatus as in claim 14 wherein said each second end of each of said fiber optic probes is coupled to a diffusing filter, said diffusing filter causing light passing from said probes to more evenly illuminate said photo-sensor.

16. The apparatus as in claim 15 wherein a transparent spacer is disposed between said diffusing filter and said multi-mode sensor unit, said transparent spacer effectively expanding a field of view of said photo-sensor.

17. The apparatus as in claim 13 wherein said apparatus is capable of performing optical testing of said one or more light emitting components in an integrated circuit component handler test environment.

18. The apparatus as in claim 13 wherein said apparatus is capable of performing optical testing of said one or more light emitting components in an automatic test equipment environment.

19. The apparatus as in claim 13 wherein said apparatus is capable of performing optical testing of said one or more light emitting components in a finished product test environment.

* * * * *